United States Patent
Bae (10) Patent No.: US 11,652,952 B2
(45) Date of Patent: May 16, 2023

(54) RAMP VOLTAGE GENERATOR, IMAGE SENSING DEVICE AND OPERATING METHOD OF THE SAME

(71) Applicant: SK hynix Inc., Gyeonggi-do (KR)

(72) Inventor: Hyuen Hee Bae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 52 days.

(21) Appl. No.: 17/346,792

(22) Filed: Jun. 14, 2021

(65) Prior Publication Data
US 2022/0247890 A1 Aug. 4, 2022

(30) Foreign Application Priority Data

Feb. 2, 2021 (KR) .......................... 10-2021-0014790

(51) Int. Cl.
| | |
|---|---|
| *H04N 5/06* | (2006.01) |
| *H04N 25/75* | (2023.01) |
| *H04N 25/616* | (2023.01) |
| *H03M 1/56* | (2006.01) |
| *H03M 3/00* | (2006.01) |

(52) U.S. Cl.
CPC ............... *H04N 5/06* (2013.01); *H03M 1/56* (2013.01); *H04N 25/616* (2023.01); *H04N 25/75* (2023.01); *H03M 3/458* (2013.01)

(58) Field of Classification Search
CPC ........ H04N 5/06; H04N 5/3575; H04N 5/378; H04N 5/363; H04N 5/37455; H04N 5/3765; H03M 1/56; H03M 3/458
See application file for complete search history.

(56) References Cited

U.S. PATENT DOCUMENTS

| | | | | |
|---|---|---|---|---|
| 8,358,360 | B2 * | 1/2013 | Koseki ................. | H04N 5/3658 348/241 |
| 2010/0091167 | A1 * | 4/2010 | Azami ...................... | H03F 3/08 348/340 |
| 2012/0133808 | A1 * | 5/2012 | Park ........................ | H04N 5/357 348/294 |
| 2018/0287599 | A1 * | 10/2018 | Tomita ..................... | G05F 3/02 |

FOREIGN PATENT DOCUMENTS

KR 10-1745892 6/2017

\* cited by examiner

*Primary Examiner* — Nhan T Tran
(74) *Attorney, Agent, or Firm* — IP &T Group LLP (57) ABSTRACT

An analog-to-digital conversion circuit includes a convertor configured to perform a first comparison operation for sensing a noise based on a reset signal and to perform a second comparison operation for sensing raw data to output data which is obtained by removing the noise from the raw data, and a ramp voltage generator configured to generate a ramp voltage used for the first comparison operation and the second comparison operation and to output the ramp voltage to the convertor. The ramp voltage generator includes a first current source for supplying a bias current for generating the ramp voltage in response to a first control signal, a second current source for supplying a boost current for generating the ramp voltage in response to a second control signal, and a generation circuit for generating the ramp voltage based on the bias current and the boost current.

13 Claims, 9 Drawing Sheets

RAMP VOLTAGE GENERATOR, IMAGE SENSING DEVICE AND OPERATING METHOD OF THE SAME

CROSS-REFERENCE TO RELATED APPLICATIONS

This patent application claims the benefit of Korean Patent Application No. 10-2021-0014790, filed on Feb. 2, 2021, the entire disclosure of which is incorporated herein by reference.

TECHNICAL FIELD

One or more embodiments described herein relate to a design for a semiconductor device and, more specifically, to a ramp signal generator, an image capturing device and operation methods thereof.

BACKGROUND

An image sensor is a device that captures an image by using a property of a semiconductor that responds to light. The image sensor may be classified into an image sensor using a Charge Coupled Device (CCD) and another image sensor using a Complementary Metal Oxide Semiconductor (CMOS), Recently, the image sensing device using the CMOS has been widely used due to an advantage that analog and digital control circuits can be implemented on a single integrated circuit (IC).

BRIEF DESCRIPTION OF THE DRAWINGS

The description herein makes reference to the accompanying drawings wherein like reference numerals refer to like parts throughout the figures.

DETAILED DESCRIPTION

Various embodiments of the disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated), The block/unit/circuit/component used with the "configured to" language include hardware—for example, circuits, memory storing program instructions executable to implement the operation, etc. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various dements, these dements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

One embodiment of the disclosure can provide an apparatus and an operating method to make an image sensor have a higher frame rate.

In addition, one embodiment of the disclosure can provide an apparatus and an operating method for supporting a high resolution and high-speed operation of an image sensor that is widely used for video recording and included in a portable device such as a mobile phone.

In an embodiment of the disclosure, an analog-to-digital conversion circuit can include a convertor configured to perform a first comparison operation for sensing a noise based on a reset signal and to perform a second comparison operation for sensing raw data to output data which is obtained by removing the noise from the raw data; and a ramp voltage generator configured to generate a ramp voltage used for the first comparison operation and the second comparison operation and to output the ramp voltage to the convertor. The ramp voltage generator can include a first current source for supplying a bias current for generating the ramp voltage in response to a first control signal; a second current source for supplying a boost current for generating the ramp voltage in response to a second control signal; and a generation circuit for generating the ramp voltage based on the bias current and the boost current.

The second current source can supply the boost current until the ramp voltage has a level equal to or higher than a target level.

The convertor can include a comparator for comparing the ramp voltage with the noise and the raw data sequentially; a clock controller for generating a dock signal; and a counter for counting the clock signal based on a result outputted from the comparator.

The first control signal and the second control signal can be activated simultaneously or sequentially. An activation section of the second control signal can be shorter than that of the first control signal.

The second control signal can be activated individually before the first comparison operation and the second comparison operation.

In another embodiment, an image sensor can include a pixel array comprising plural pixels; a driver configured to output a reset signal and a transfer signal to the pixel array; a convertor configured to perform a first comparison operation for sensing a noise, outputted from the pixel array based on the reset signal, to perform a second comparison operation for sensing raw data, outputted from the pixel array based on the transfer signal, and to output data which is obtained by removing the noise from the raw data; and a ramp voltage generator configured to generate a ramp voltage used for the first comparison operation and the second comparison operation and to output the ramp voltage to the convertor; and a data output circuit configured to collect the data outputted from the convertor and to generate image data. The ramp voltage can be settled to a target level after being boosted over the target level.

The ramp voltage generator can include a first current source for supplying a bias current for generating the ramp voltage in response to a first control signal; a second current source for supplying a boost current for generating the ramp voltage in response to a second control signal; and a generation circuit for generating the ramp voltage based on the bias current and the boost current.

The first control signal and the second control signal can be activated simultaneously or sequentially, and an activation section of the second control signal is shorter than that of the first control signal.

The second control signal can be activated individually before the first comparison operation and the second comparison operation.

The convertor can include a comparator for comparing the ramp voltage with the noise and the raw data sequentially; a clock controller for generating a clock signal; and a counter for counting the clock signal based on a result outputted from the comparator.

The pixel array can be configured to output the noise and the raw data on a column basis. The convertor can include plural components for performing the first and second comparison operations to recognize the noise and the raw data output on the column basis. The ramp voltage generator can supply the ramp voltage having a constant sloped level to the convertor.

In another embodiment, an image sensor can include a ramp voltage generator supplying a ramp voltage to a convertor configured to perform a first comparison operation for sensing a noise transferred from a pixel array and to perform a second comparison operation for sensing raw data transferred from the pixel array. A method for operating an image sensor can include generating a bias current in response to a first control signal for generating the ramp voltage; generating a boost current in response to a second control signal for generating the ramp voltage; and generating the ramp voltage based on the bias current and the boost current.

The ramp voltage can be settled to a target level after being boosted over the target level.

The first control signal and the second control signal can be activated simultaneously or sequentially. An activation section of the second control signal can be shorter than that of the first control signal.

The second control signal can be activated before each of first comparison operation and the second comparison operation.

In another embodiment, an operating method of an image sensor can include raising a ramp voltage to a level for each of first and second comparison operations after an auto-zeroing operation; and boosting the ramp voltage being raised to the level.

Embodiments of the disclosure will now be described with reference to the accompanying drawings, wherein like numbers reference like elements.

Figure 1:
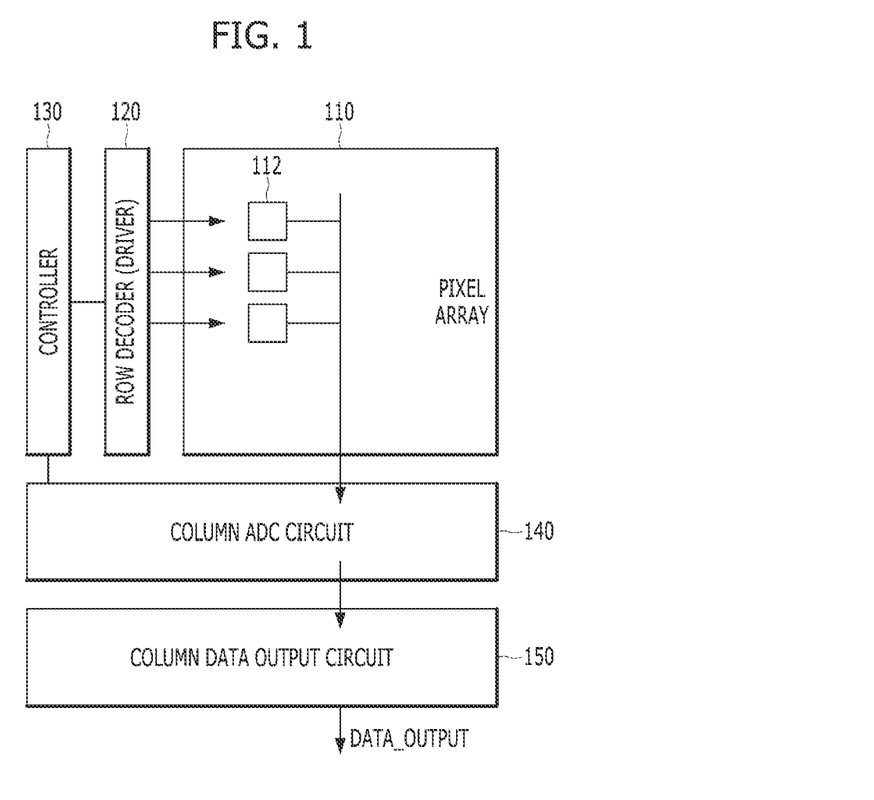
FIG. 1 illustrates an image sensor according to one embodiment of the disclosure.

FIG. 1 illustrates an image sensor according to an embodiment of the disclosure. The image sensor (CMOS image Sensor, CIS) described in FIG. 1 can be widely used in devices used in various technical fields such as a mobile phone, a surveillance security device, an autonomous driving system, a machine vision system, and an Internet of Things (IoT) device.

Referring to FIG. 1, the image sensor may include a pixel array 110, a row decoder 120, a controller 130, an analog-to-digital conversion circuit 140, and a data output circuit 150. According to an embodiment, the image sensor can further include another module or circuit not shown in FIG. 1.

The pixel array 110 may include a plurality of pixels 112. The pixel array 110 can have a structure that plurality of pixels 112 is arranged in horizontal and vertical directions. Each pixel 112 can include one photodiode and four transistors. According to one embodiment, the pixel 112 can include one photodiode and three transistors. Further, according to another embodiment, the pixel 112 can include plural photodiodes.

The row decoder 120 (e.g., driver) may drive plural pixels 112 included in the pixel array 110 on a row basis. When the row decoder 120 drives the plural pixels 112 on a row basis, the plural pixels 112 may transmit data or signals to the analog-to-digital conversion circuit 140 through each line arranged for each column. The row decoder 120 may be controlled by the controller 130.

The controller 130 may be involved in overall operations of the image sensor. The controller 130 may control the row decoder 120, the analog-to-digital conversion circuit 140, and the data output circuit 150.

The signal or information output from the pixels 112 driven by the row decoder 120 is a kind of analog signal. The analog-to-digital conversion circuit 140 may convert an analog signal or information output from the pixel 112 into a digital signal or information. The digital signal or information calculated by the analog-to-digital conversion circuit 140 may be temporarily stored or collected by the data output circuit 150, and the output data DATA_OUTPUT is transferred by the controller 130 to another device (e.g., an image signal processor, circuit, module or etc.), According to one embodiment, the data output circuit 150 can output raw Bayer data (e.g., raw output of Bayer-filter cameras or a Bayer pattern image), For example, a Bayer-filter pattern is 50% green, 25% red and 25% blue, hence is also called BGGR, RGBG, GRBG, or RGGB.

The analog-to-digital conversion circuit 140 included in the image sensor may have a signal reading structure (e.g., a column-parallel structure in which units or modules operating on a column basis are arranged in parallel). The analog-to-digital conversion circuit 140 having such a structure can reduce noise and increase a bandwidth in a process of reading pixel data output from the pixel array 110, Through this process, the analog-to-digital conversion circuit 140 may read data output from the pixel array 110 to reduce signal quality deterioration and support the output of read pixel data at a very high speed.

As the resolution of the image sensor increases, the size (e.g., planar area or pitch) of the pixels 112 in the pixel array 110 decreases. As the image sensor supports a higher frame rate, the time for the pixel 112 in the pixel array 110 to receive incident light and convert the incident light to electrical charge may be shorter. In addition, as the image sensor is mounted on a small device such as a portable terminal or a camera, the size of the image sensor can be limited. For these reasons, the analog-to-digital conversion circuit 140 is arranged in each column at a narrow interval, and a size or amplitude of the signal or information output from the pixel array 110 decreases, so that the analog-to-digital conversion circuit 140 could be designed under very strict constraints.

Figure 2:
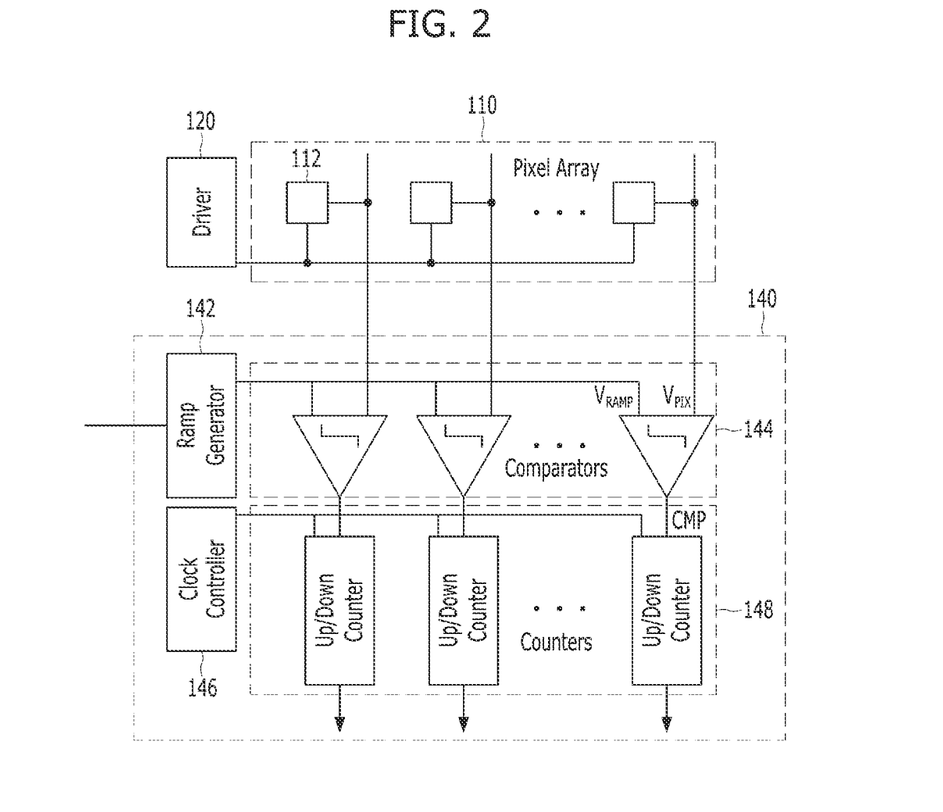
FIG. 2 illustrates an example of a column analog-to-digital conversion (ADC) circuit described in FIG. 1.

FIG. 2 illustrates an example of a column analog-to-digital conversion (ADC) circuit described in FIG. 1.

Referring to FIG. 2, the analog-to-digital conversion circuit 140 may include a ramp voltage generator 142, a dock signal controller 146, a comparator 144, and a counter 148. The plurality of pixels 112 included in the pixel array 110 may be driven by the row decoder 120 (indicated as driver 120 on FIG. 2) to transmit pixel information or raw signal $V_{PIX}$ to the comparator 144. The ramp voltage generator 142 supplies a ramp voltage $V_{RAMP}$ to the comparator 144. The comparator 144 compares the ramp voltage $V_{RAMP}$ with the pixel information or raw signal $V_{PIX}$ transmitted from the pixel array 110 and outputs a comparison result CMP. The clock signal controller 146 provides a clock signal having a preset period to the counter 148. The counter 148 counts the clock signal in response to the comparison result CMP output from the comparator 144. Through these operations, the pixel information or raw signal $V_{PIX}$ transmitted from the pixel array 110, which is an analog value, can be converted into a result (Counter Output, see FIG. 3) output from the counter 148, which is a digital value.

The analog-to-digital conversion circuit 140 shown in FIG. 2 has a column-parallel structure. As described above, the column-parallel structure is a structure in which each conversion module corresponding to each column is arranged. Herein, the conversion module is used for converting the pixel information or raw signal $V_{PIX}$ to the digital value. After plural pixels 112 arranged corresponding to a single row in the pixel array 110 are selected, the pixel information or raw signals $V_{PIX}$ are transmitted through plural column lines respectively connected to the plural pixels 112 of the selected row. The conversion modules arranged in a column-parallel structure convert respective analog information or raw signals $V_{PIX}$ into respective digital values (pixel data). The ramp voltage $V_{RAMP}$ output from the ramp voltage generator 142 may be shared with plural conversion modules arranged in the column-parallel structure. According to one embodiment, the ramp voltage generator 142 may be driven by a control signal (e.g., Ramp_En, Boost_En, see FIGS. 5 and 7) transmitted from the controller 130. Because the conversion module arranged for each column in the analog-to-digital conversion circuit 140 includes a comparator and a counter, the conversion module does not need a large area so that plural conversion modules in the analog-to-digital conversion circuit 140 could be integrated at a narrow interval.

In one embodiment, the plural pixels 112 included in the pixel array 110 in the image sensor can output a fixed pattern noise (FPN) in which different information or signals are output in the same environment (e.g., lighting, etc.). The fixed pattern noise FPN may be generated due to mismatching of transistors arranged in units of columns included in the plural pixels 112 and a dark current generated in the plural pixels 112. The analog-to-digital conversion circuit 140 may perform a correlated double sampling (CDS) operation to remove the fixed pattern noise (FPN), The correlated double sampling (CDS) operation will be described later in FIG. 3.

As the number of pixels in the pixel array 110 included in the image sensor (CIS) and the frame rate increase, the analog-to-digital conversion circuit 140 may be differently designed for reading and converting outputs of the plural pixels 112 fast. According to one embodiment, the analog-to-digital conversion circuit 140 may include a single-slope ADC (SS-ADC) having a high linearity and occupying a small area (e.g., highly integrated). The single-slope ADC (SS-ADC) can be difficult to achieve in a short analog-to-digital conversion time and at a high resolution because the single-slope ADC (SS-ADC) uses a great number of docks for analog-to-digital conversion. In addition, according to this embodiment, in order to overcome a disadvantage of the single-slope ADC (SS ADC), the analog-digital conversion circuit 140 can include a delta-sigma conversion circuit (e.g., delta-sigma AZ ADC), a cyclic conversion circuit (e.g., cyclic ADC), or a successive approximation register conversion circuit (e.g., SAR ADC). Herein, the delta-sigma conversion circuit (ΔΣ ADC) and the cyclic conversion circuit (cyclic ADC) may have a low noise and a short analog-to-digital conversion time. But the delta-sigma conversion circuit (ΔΣ ADC) and the cyclic conversion circuit (cyclic ADC) should use an operational amplifier (Op Amp) with high power consumption. A successive approximation register conversion circuit (SAR ADC) can include a capacitor, a digital-to-analog converter (DAC), a SAR logic and a comparator, which may reduce power consumption and have a short analog-to-digital conversion time, but may have a large noise and occupy a large area.

Figure 3:
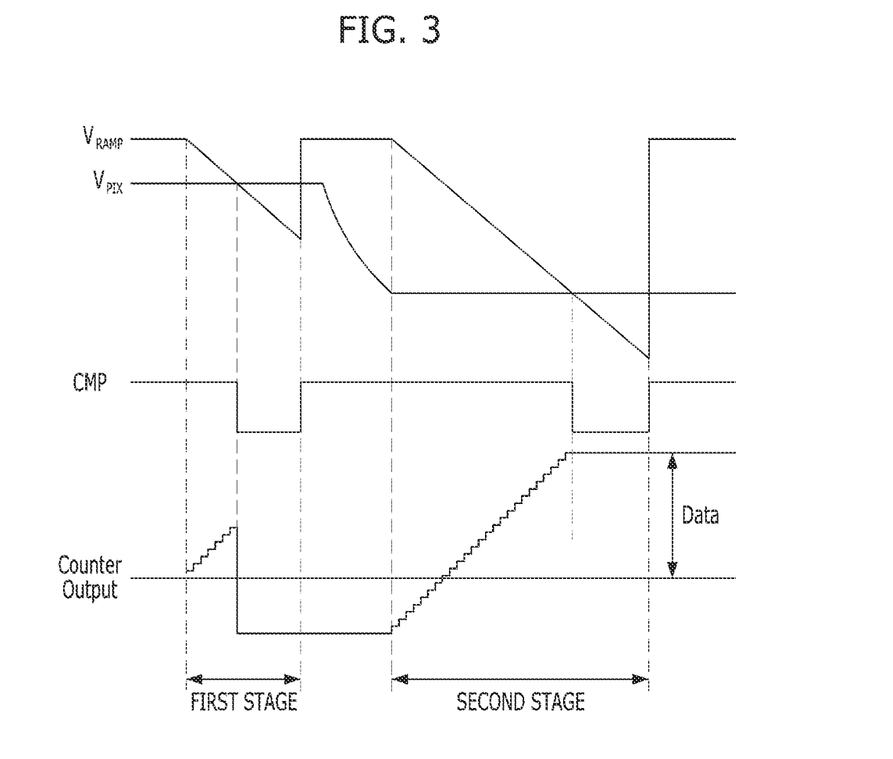
FIG. 3 illustrates an operation of the image sensor described in FIGS. 1 to 2.

FIG. 3 illustrates an operation of the image sensor described in FIGS. 1 to 2.

Referring to FIGS. 1 to 3, the operation of the image sensor can be described, referring to a ramp voltage $V_{RAMP}$ output from the ramp voltage generator 142, pixel information or raw signal $V_{PIX}$ output from the pixel 122, a comparison result CMP output from the comparator 144 and a result Counter Output output from the counter 148. In particular, the analog-to-digital conversion circuit 140 may perform two comparison operations. The first comparison operation (indicated as "first stage" in FIG. 3) and the second comparison operation (indicated as "second stage" in FIG. 3) performed by the analog-to-digital conversion circuit 140 may be related to a correlated double sampling (CDS) operation.

The pixel information or raw signal $V_{PIX}$, which is output from the pixel 122 by a reset signal (RX, see FIG. 4), may have a potential indicating a reset state of the pixel 122. This potential can be changed when a photo conversion element (e.g., photodiode) generates electrical charge in response to incident light. During the first comparison operation of the comparator 144, the analog-to-digital conversion circuit 140 may compare the potential indicating the reset state, which is output by the reset signal RX, with the ramp voltage $V_{RAMP}$. When the ramp voltage $V_{RAMP}$ is lower than the pixel information or raw signal $V_{PIX}$ output from the pixel 122, the comparison result CMP is changed (e.g., from '1' to '0'). The counter 148 can count a clock signal unto the comparison result CMP is changed, so as to obtain a value corresponding to a noise.

After the photo conversion element (e.g., photodiode) in the pixel 122 generates electrical charge in response to incident light, the pixel information or raw signal $V_{PIX}$ output from the pixel 122 is changed. During the second comparison operation, the comparator 144 can compare the pixel information or raw signal $V_{PIX}$ output from the pixel 122 with the ramp voltage $V_{RAMP}$. When the ramp voltage $V_{RAMP}$ is lower than the pixel information or raw signal $V_{PIX}$ output from the pixel 122, the comparison result CMP is changed again (e.g., from '1' to '0'). The counter 148 can count the clock signal until the comparison result CMP is changed, in order to obtain pixel data corresponding to the incident light. When a first value obtained in the first comparison operation is subtracted from a second value obtained in the second comparison operation through the correlated double sampling (CDS) operation, the pixel data (Data) corresponding to an amount of electrical charge, which are generated by the pixel 122 in response to the incident light, can be obtained with reduced noise or without a noise.

The ramp voltage $V_{RAMP}$ illustrated in FIG. 3 can have a preset constant slope. The analog-to-digital conversion circuit 140 may output a digital signal (e.g., a digital code) corresponding to a time or a timing at which the pixel information or raw signal $V_{PIX}$ output from the pixel 122 and the ramp voltage $V_{RAMP}$ have the same level. The preset constant slope of the ramp voltage $V_{RAMP}$ may be related to a resolution of output images. The linearity of the analog-to-digital conversion performed by the analog-to-digital conversion circuit 140 may be improved when the slope of the ramp voltage $V_{RAMP}$ is not changed but keeps constant even though some factors such as parasitic capacitors may affect adversely, FIG. 4 illustrates a ramp voltage $V_{RAMP}$ described in FIGS. 2 to 3.

Figure 4:
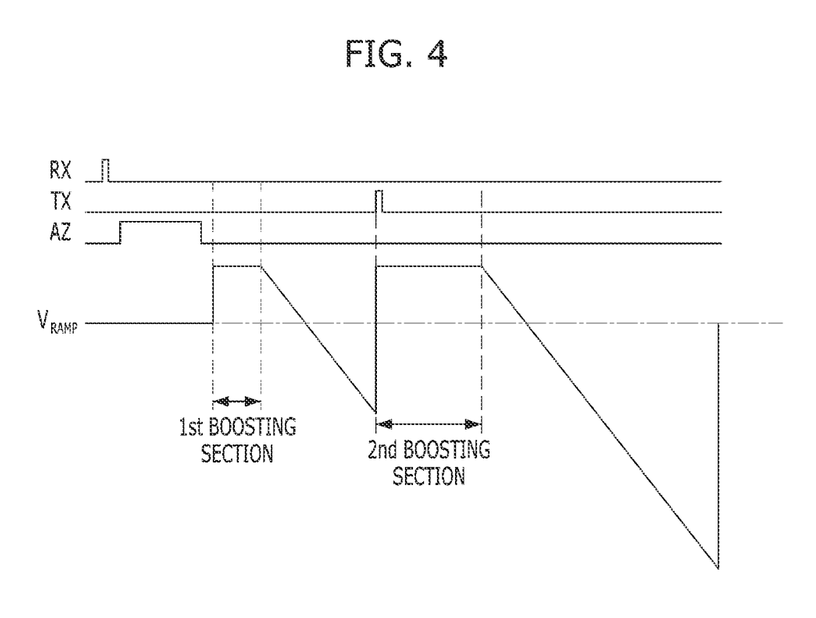
FIG. 4 illustrates a ramp voltage described in FIGS. 2 to 3.
Figure 5:
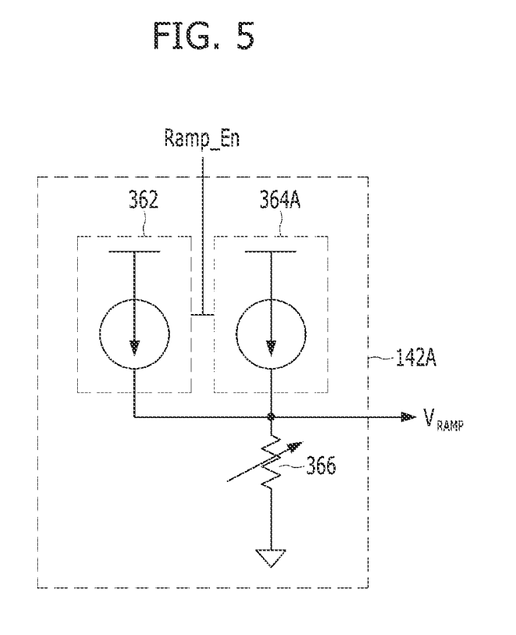
FIG. 5 illustrates a ramp voltage generator according to another embodiment of the disclosure.
Figure 7:
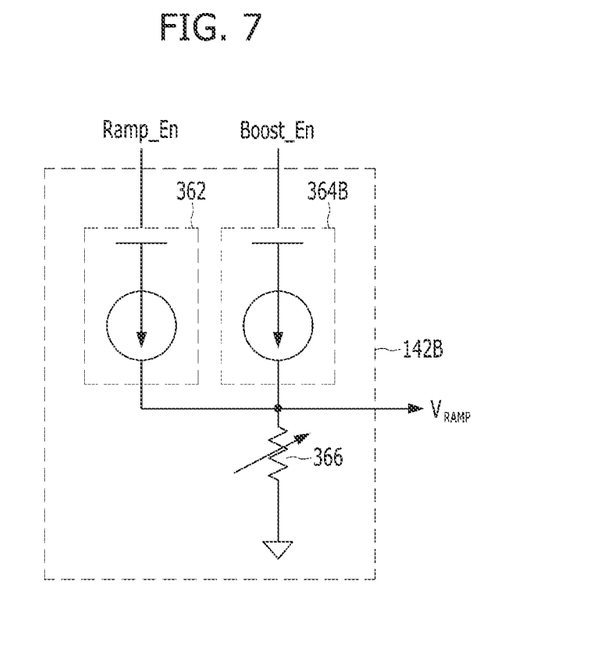
FIG. 7 illustrates a ramp voltage generator according to another embodiment of the disclosure.

Referring to FIG. 4, the ramp voltage $V_{RAMP}$ should reach a preset target level or potential respectively before the first and second comparison operations (first and second stages shown in FIG. 3) performed by the comparator 144. The comparator 144 can compare the pixel information or raw signal $V_{PIX}$ output from the pixel 122 with the ramp voltage $V_{RAMP}$. Further, during each of the first and second comparison operations, the ramp voltage $V_{RAMP}$ should be changed at a constant slope. A ramp enable signal Ramp_En may be used for generating the ramp voltage $V_{RAMP}$ as shown in FIGS. 5 and 7. After an auto-zeroing operation, the ramp enable signal Ramp_En may be activated from a start of the first boosting section to an end of the second comparison operation.

According to one embodiment, the image sensor can output data Data_Output (as shown in FIG. 1) corresponding to incident light of the pixel 112 through the Auto-zeroing operation, the first comparison operation (first stage), and the second comparison operation (second stage). During the auto-zeroing operation according to an auto-zeroing signal AZ, the image sensor may match a level of the ramp signal $V_{RAMP}$ with a level of the pixel information or raw signal $V_{PIX}$ output from the pixel 122, During the first comparison operation (first stage), the image sensor may measure a potential (e.g., voltage level) remaining in the pixel 122 as a reference for obtaining accurate pixel data without a noise. The voltage level measured during the first comparison operation (first stage) may be different for each pixel 122, During the second comparison operation (second stage), the image sensor may convert the pixel information or raw signal $V_{PIX}$ obtained based on an amount of electrical charge generated in response to the incident light into a digital value to output the data DATA_OUTPUT.

Referring to FIG. 4, during a first boosting section between the auto-zeroing (AZ) operation and the first comparison operation (i.e., the "first stage" of FIG. 3), the ramp voltage $V_{RAMP}$ is raised to a preset target level. During a second boosting section between the first comparison operation (the "first stage" of FIG. 3) and the second comparison operation (i.e., the "second stage" of FIG. 3), the ramp voltage $V_{RAMP}$ is also raised to the preset target level. As a level of the ramp voltage $V_{RAMP}$ increases faster, i.e., is boosted during the first and second boosting sections, the first and second boosting sections for raising the ramp voltage $V_{RAMP}$ to the preset target level may be shortened, so that the first comparison operation (first stage) and the second comparison operation (second stage) may be performed earlier. Through this, it is possible to increase a frame rate of the image sensor.

FIG. 5 illustrates a ramp voltage generator 142A according to one embodiment of the disclosure.

Referring to FIG. 5, the ramp voltage generator 142A can include a first current circuit 362 for providing a bias current used for generating the ramp voltage $V_{RAMP}$ in response to a ramp enable signal Ramp_En, a second current circuit 364A for providing a boost current used for generating a ramp voltage $V_{RAMP}$ in response to the enable signal Ramp_En, and a generation circuit 366 for generating a ramp voltage $V_{RAMP}$ based on the bias current and the boost current. According to one embodiment, the first current circuit 362 and the second current circuit 364A may include a current source individually. The generation circuit 366 may include a variable resistor. The current source and the variable resistor shown in FIG. 5 are given as an example, and the configurations of the first current circuit 362, the second current circuit 364A and the generation circuit 366 included in the ramp voltage generator 142A can be different according to one embodiment.

Figure 6:
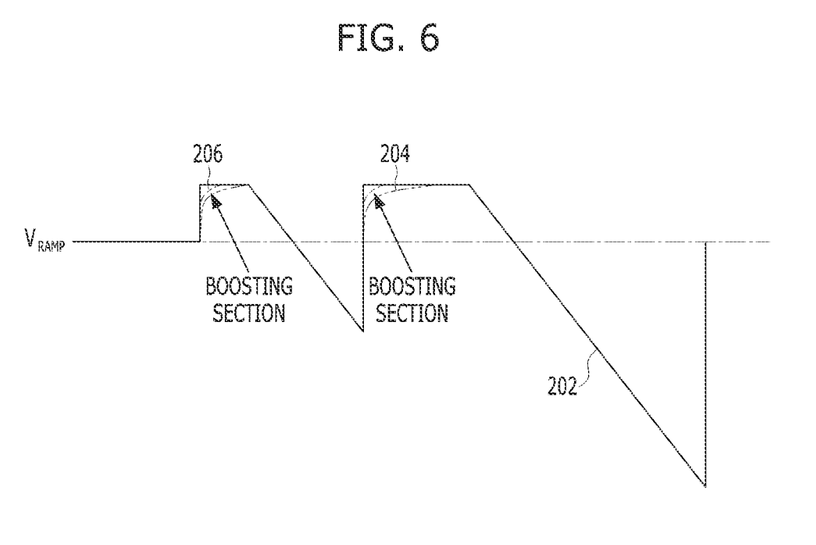
FIG. 6 illustrates an operation of the ramp voltage generator described in FIG. 5.

FIG. 6 illustrates an operation of the ramp voltage generator 142A described in FIG. 5.

Referring to FIGS. 5 and 6, the ramp voltage $V_{RAMP}$ output from the ramp voltage generator 142A may be preset to have a target level 202, However, when the ramp voltage generator 142A includes the first current circuit 362 for generating the bias current but does not include the second current circuit 364A for generating the boost current, the ramp voltage $V_{RAMP}$ can practically have a first potential 204 slowly reaching the target level 202 as shown by the dashed curve line segments in FIG. 6, The first potential 204 takes a longer time to rise to the preset target level, as compared with the designed target level 202, In one embodiment, when the ramp voltage generator 142A uses the first current circuit 362 and the second current circuit 364A, a higher amount of current can be supplied quickly, so that the ramp voltage $V_{RAMP}$ can increase faster or can be boosted like a second potential 206. That is, because of the second current circuit 354A providing the boost current, the ramp voltage $V_{RAMP}$ may have a second potential 206 that rises to the preset target level 202 within a faster time than the first potential 204. As the ramp voltage $V_{RAMP}$ rises to the preset target level at a faster time, the boosting section described in FIG. 4 may be shortened.

FIG. 7 illustrates a ramp voltage generator 142B according to another embodiment of the disclosure.

Referring to FIG. 7, the ramp voltage generator 142B can include a first current circuit 362 for providing a bias current used for generating a ramp voltage $V_{RAMP}$ in response to a ramp enable signal Ramp_En, a second current circuit 364 for providing a boost current used for generating a ramp voltage $V_{RAMP}$ in response to a boost enable signal Boost_En, and a generation circuit 366 for generating a ramp voltage $V_{RAMP}$ based on the bias current and the boost current. According to one embodiment, the first current circuit 362 and the second current circuit 364 may include a current source. The generation circuit 366 may include a variable resistor. The current source and the variable resistor shown in FIG. 7 are given as an example, and the configurations of the first current circuit 362, the second current circuit 364, and the generation circuit 366 included in the ramp voltage generator 1423 can be different according to one embodiment.

As comparing the ramp voltage generators 142A, 142B described in FIGS. 5 and 7 with each other, there is a difference between the second current circuits 364A, 364B The second current circuit 364A described in FIG. 5 may be controlled by the ramp enable signal Ramp_En, which is also applied to the first current circuit 362. However, the second current circuit 364B described in FIG. 7 may be controlled by the boost enable signal Boost_En which is different and distinguishable from the ramp enable signal Ramp_En applied to the first current circuit 362. The boost enable signal Boost_En can be activated simultaneously with the ramp enable signal Ramp_En. However, in one embodiment, the boost enable signal Boost_En can be activated in a shorter section than the ramp enable signal Ramp_En. In the ramp voltage generator 142B, the second current circuit 364B may be used only in a part of the duration of the boosting section and might not be activated in other operation sections.

According to one embodiment, the boost enable signal Boost_En and the ramp enable signal Ramp_En may be sequentially activated. Even if the boost enable signal Boost_En and the ramp enable signal Ramp_En are sequentially activated, the activation section of the boost enable signal Boost_En may be overlapped with the activation section of the ramp enable signal Ramp_En.

Figure 8:
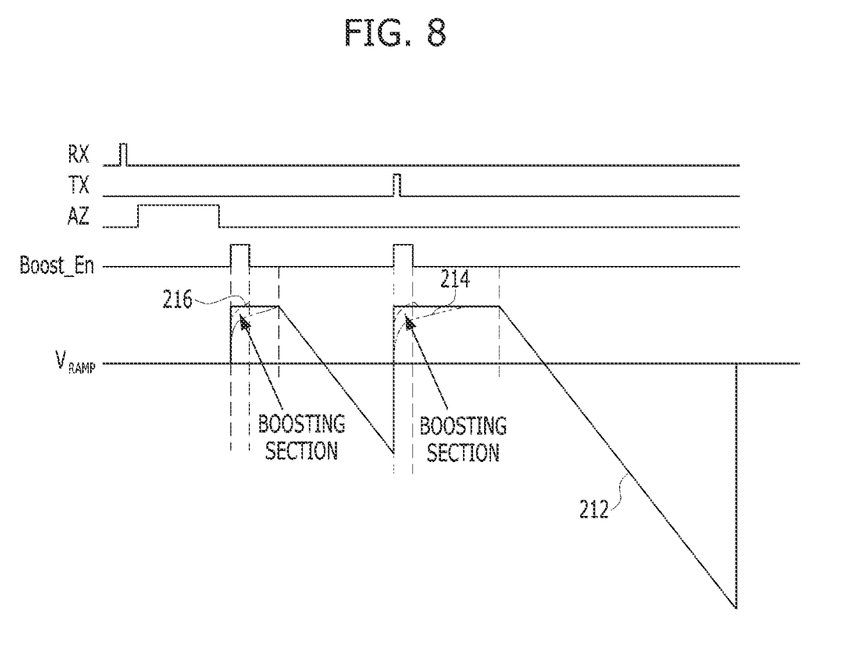
FIG. 8 illustrates an operation of the ramp voltage generator described in FIG. 7.

FIG. 8 illustrates an operation of the ramp voltage generator 142B described in FIG. 7.

Referring to FIGS. 7 and 8, the ramp voltage $V_{RAMP}$ output from the ramp voltage generator 142B may be preset to have a target level 212. However, when the ramp voltage generator 142B includes the first current circuit 362 for generating the bias current but does not include the second current circuit 364B for generating the boost current, the ramp voltage $V_{RAMP}$ can practically have a first potential 214 slowly reaching the target level 212 as shown by the dashed curve line segments in FIG. 8 The first potential 214 takes a longer time to rise to the preset target level, as compared with the designed target level 212.

In one embodiment, when the ramp voltage generator 142B uses the first current circuit 362 and the second current circuit 364B, a higher amount of current can be supplied quickly, so that the ramp voltage $V_{RAMP}$ can increase faster like a second potential 216. That is, because of the second current circuit 354B providing the boost current, in this embodiment, the ramp voltage $V_{RAMP}$ may have a second potential 206 that temporarily rises over the preset target level 212. The second current circuit 354B can induce a temporary overvoltage condition in which the ramp voltage $V_{RAMP}$ exceeds a preset target level 212 for a short time, During the boosting section, this overvoltage condition may be a help to reach the preset target level 212 quickly. Accordingly, the ramp voltage $V_{RAMP}$ may increase to a preset potential level at a faster time, and the boosting section described in FIG. 4 may be shortened.

Figure 9:
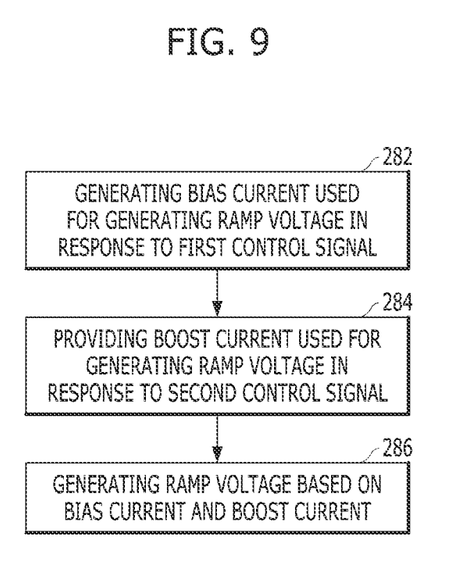
FIG. 9 illustrates a method for operating an image sensor according to another embodiment of the disclosure.

FIG. 9 illustrates a method for operating an image sensor according to another embodiment of the disclosure. Referring to FIGS. 1 to 8, the image sensor can include a pixel array 110 including plural pixels 112. The image sensor can further include an analog-digital conversion circuit 140 configured to perform a first comparison operation (first stage) to detect a noise transmitted from the pixel 112 and a second comparison operation (second stage) to detect raw data, and a ramp voltage generator 142 configured to supply a ramp voltage $V_{RAMP}$ to the analog-digital conversion circuit 140.

Referring to FIG. 9, the method for operating an image sensor can include generating a bias current used for generating the ramp voltage $V_{RAMP}$ in response to a first control signal (at dement 282), providing a boost current used for generating the voltage a ramp voltage $V_{RAMP}$ in response to a second control signal (at element 284), and generating the ramp voltage $V_{RAMP}$ based on the bias current and the boost current (at element 286).

According to one embodiment, the bias current may be used maintaining or adjusting a potential of the ramp voltage $V_{RAMP}$, and the boost current may be used for a short time to boost the potential of the ramp voltage $V_{RAMP}$. Referring to FIG. 8, in one embodiment, due to the boost current, the ramp voltage $V_{RAMP}$ may rise until it has a potential equal to or higher than a preset target level, like the second potential 216 described in FIG. 8, When the boost current is not applied, the ramp voltage $V_{RAMP}$ can be stabilized to the preset target level.

According to one embodiment, the second control signal and the first control signal can be simultaneously activated, but the second control signal may have a shorter activation section than the first control signal. The second control signal can be deactivated earlier than the first control signal. For example, referring to FIG. 7, the first control signal may be the ramp enable signal Ramp_En, and the second control signal may be the boost enable signal Boost_En. Further, referring to FIG. 4, in a process of outputting the output data DATA_OUTPUT based on the pixel information or raw signal $V_{PIX}$ output from the pixel 112 through analog-to-digital conversion circuit 140, the second control signal can be activated twice before the first and second comparison operations. According to one embodiment, the second control signal and the first control signal may be sequentially activated.

According to one embodiment of the disclosure, an image sensor can reduce a time spent on stabilizing a ramp signal so that the image sensor can reduce a time spent on converting a pixel signal into a digital signal.

Further, since an image sensor according to one embodiment of the disclosure can support a high frame rate, the image sensor can be embedded in a wider variety of devices for various purposes.

While the present teachings have been illustrated and described with respect to the specific embodiments, it will be apparent to those skilled in the art in light of the present disclosure that various changes and modifications may be made without departing from the spirit and scope of the disclosure as defined in the following claims.

What is claimed is:

1. An analog-to-digital conversion circuit, comprising:
a convertor configured to perform a first comparison operation for sensing a noise based on a reset signal and to perform a second comparison operation for sensing raw data to output data which is obtained by removing the noise from the raw data; and
a ramp voltage generator configured to generate a ramp voltage used for the first comparison operation and the second comparison operation and to output the ramp voltage to the convertor,
wherein the ramp voltage generator comprises:
a first current source for supplying a bias current for generating the ramp voltage in response to a first control signal;
a second current source for supplying a boost current for generating the ramp voltage in response to a second control signal, wherein the second current source supplies the boost current until the ramp voltage has a level higher than a target level; and
a generation circuit for generating the ramp voltage based on the bias current and the boost current.

2. The analog-to-digital conversion circuit according to claim 1, wherein the convertor comprises:
a comparator for comparing the ramp voltage with the noise and the raw data sequentially;
a clock controller for generating a clock signal; and
a counter for counting the clock signal based on a result outputted from the comparator.

3. The analog-to-digital conversion circuit according to claim 1, wherein the first control signal and the second control signal are activated simultaneously or sequentially, and an activation section of the second control signal is shorter than that of the first control signal.

4. The analog-to-digital conversion circuit according to claim 3, wherein the second control signal is activated individually before the first comparison operation and the second comparison operation.

5. An image sensor, comprising:
a pixel array comprising plural pixels;
a driver configured to output a reset signal and a transfer signal to the pixel array;
a convertor configured to perform a first comparison operation for sensing a noise, outputted from the pixel array based on the reset signal, to perform a second comparison operation for sensing raw data, outputted from the pixel array based on the transfer signal, and to output data which is obtained by removing the noise from the raw data; and
a ramp voltage generator configured to generate a ramp voltage used for the first comparison operation and the second comparison operation and to output the ramp voltage to the convertor; and
a data output circuit configured to collect the data outputted from the convertor and to generate image data,
wherein the ramp voltage is settled to a target level after being boosted over the target level by a boost current which is supplied until the ramp voltage has a level higher than the target level.

6. The image sensor according to claim 5, wherein the ramp voltage generator comprises:
a first current source for supplying a bias current for generating the ramp voltage in response to a first control signal;
a second current source for supplying the boost current for generating the ramp voltage in response to a second control signal; and
a generation circuit for generating the ramp voltage based on the bias current and the boost current.

7. The image sensor according to claim 6, wherein the first control signal and the second control signal are activated simultaneously or sequentially, and an activation section of the second control signal is shorter than that of the first control signal.

8. The image sensor according to claim 6, wherein the second control signal is activated respectively before the first comparison operation and the second comparison operation.

9. The image sensor according to claim 5, wherein the convertor comprises:
a comparator for comparing the ramp voltage with the noise and the raw data sequentially;
a clock controller for generating a clock signal; and
a counter for counting the clock signal based on a result outputted from the comparator.

10. The image sensor according to claim 5,
wherein the pixel array is configured to output the noise and the raw data on a column basis,
wherein the convertor comprises plural components for performing the first and second comparison operations to recognize the noise and the raw data output on the column basis, and
wherein the ramp voltage generator supplies the ramp voltage having a constant sloped level to the convertor.

11. A method for operating an image sensor comprising a ramp voltage generator supplying a ramp voltage to a convertor configured to perform a first comparison operation for sensing a noise transferred from a pixel array and to perform a second comparison operation for sensing raw data transferred from the pixel array, the method comprising:
generating a bias current in response to a first control signal for generating the ramp voltage;
generating a boost current in response to a second control signal for generating the ramp voltage; and
generating the ramp voltage based on the bias current and the boost current,
wherein the boost current is supplied until the ramp voltage has a level higher than a target level, and the ramp voltage is settled to the target level after being boosted over the target level.

12. The method according to claim 11, wherein the first control signal and the second control signal are activated simultaneously or sequentially, and an activation section of the second control signal is shorter than that of the first control signal.

13. The method according to claim 11, wherein the second control signal is activated before each of the first comparison operation and the second comparison operation.

* * * * *